United States Patent [19]

Krulik

[11] Patent Number: 4,601,784
[45] Date of Patent: Jul. 22, 1986

[54] SODIUM PERMANGANATE ETCH BATHS CONTAINING A CO-ION FOR PERMANGANATE AND THEIR USE IN DESMEARING AND/OR ETCHING PRINTED CIRCUIT BOARDS

[75] Inventor: Gerald Krulik, LaGuna Hills, Calif.

[73] Assignee: Morton Thiokol, Inc., Chicago, Ill.

[21] Appl. No.: 739,726

[22] Filed: May 31, 1985

[51] Int. Cl.$^4$ .............. B44C 1/22; B29C 17/08; C03C 15/00; C03C 25/06
[52] U.S. Cl. .............. 156/655; 134/22.17; 134/27; 134/29; 156/644; 156/645; 156/668; 156/902; 252/79.5; 252/156; 427/307
[58] Field of Search .............. 134/22.1, 22.17, 27, 134/29; 427/307; 252/79.5, 156; 156/644, 645, 655, 666, 668, 902

[56] References Cited

U.S. PATENT DOCUMENTS

| | | | |
|---|---|---|---|
| 1,969,678 | 8/1934 | White et al. | 41/42 |
| 2,908,557 | 10/1959 | Black et al. | 41/42 |
| 3,293,148 | 12/1966 | Dell et al. | 252/103 |
| 3,425,947 | 2/1969 | Rausch et al. | 252/105 |
| 3,457,107 | 7/1969 | Mickelson et al. | 134/3 |
| 3,489,625 | 1/1970 | Dell et al. | 156/18 |
| 3,506,397 | 4/1970 | Vincent et al. | 23/165 |
| 3,598,630 | 8/1971 | Doty et al. | 117/47 |
| 3,625,758 | 12/1971 | Stahl et al. | 117/212 |
| 3,647,699 | 3/1972 | Doty et al. | 252/79.2 |
| 3,652,351 | 3/1972 | Guisti | 156/2 |
| 3,689,303 | 9/1972 | Maguire et al. | 117/47 A |
| 3,833,414 | 9/1974 | Grisik et al. | 134/3 |
| 4,042,729 | 8/1977 | Polichette et al. | 427/304 |
| 4,054,693 | 10/1977 | Leech et al. | 427/304 |
| 4,073,740 | 2/1978 | Polichette et al. | 252/156 |
| 4,294,651 | 10/1981 | Ohmura | 156/662 |
| 4,425,380 | 1/1984 | Duffy et al. | 427/97 |
| 4,430,154 | 2/1984 | Stahl et al. | 156/651 |

FOREIGN PATENT DOCUMENTS

| | | |
|---|---|---|
| 0109920 | 5/1984 | European Pat. Off. |
| 1479556 | 7/1977 | United Kingdom |
| 2134140 | 8/1984 | United Kingdom |

OTHER PUBLICATIONS

Nuzzi, F. J., "An Improved Permanganate Smear Removal Process," PC FAB, Mar. 1984.
Enthone Incorporated Data Sheet For ENPLATE MLB-947, Feb. 1984.
Latimer, W. M., *The Oxidation States of the Elements And Their Potentials in Aqueous Solution*, Second Edition, pp. 54–62, 78–80, and 238–241.
Cotton, F. A. et al., *Advanced Inorganic Chemistry*, 1962, pp. 694, 699 and 700.
Stewart, R., *Oxidation By Permanganate*, 1965.
Pourbaix, M., *Atlas of Electrochemical Equilibria In Solutions*, pp. 289–292, 551–553, 595–602, and 609–613.
Deckert, C. A.; Couble, E. C.; Bonetti, W. F., "Improved Method for the Elimination of Layer Smearing in Multilayer Circuits", *Galvanotechnik*, vol. 75, (1984), No. 5, pp. 662–672.
Deckert et al., Improved Post-Desmear Process for Multilayer Boards, Printed Circuit World Convention III, WC111-37, May 22–25, 1984, technical paper, pp. 1–12.

*Primary Examiner*—William A. Powell
*Attorney, Agent, or Firm*—Richard J. Sheridan; Gerald K. White

[57] ABSTRACT

Aqueous, alkaline liquid NaMnO$_4$ solutions are provided which provide excellent resin desmearing and etchback, especially in the manufacture of printed circuit boards. The solutions comprise water, alkali metal hydroxide, NaMnO$_4$ and from about 0.1 to about 3.0 moles per mole of MnO$_4^-$ of a co-ion for MnO$_4^-$ selected from the group consisting of K$^+$, Cs$^+$, Rb$^+$ and mixtures thereof.

13 Claims, 3 Drawing Figures

SODIUM PERMANGANATE ETCH BATHS CONTAINING A CO-ION FOR PERMANGANATE AND THEIR USE IN DESMEARING AND/OR ETCHING PRINTED CIRCUIT BOARDS

BACKGROUND OF THE INVENTION

1. Field of the Invention

This invention relates to aqueous, alkaline liquid sodium permanganate ($NaMnO_4$) solutions which contain a co-ion for $MnO_4^-$ selected from the group consisting of $K^+$, $Cs^+$, $Rb^+$ and mixtures thereof. The invention also relates to processes of removing resin smear on the interior walls of holes formed in insulating substances (e.g., printed circuit boards) and/or etching the interior walls of such holes using the aqueous, alkaline liquid $NaMnO_4$ solutions of this invention.

2. Description of the Prior Art

Hole forming operations in resin containing materials often result in the smearing of resin over the interior wall or barrel of a hole. This resin smear is primarily attributable to the generation or utilization of temperatures exceeding the melting point of a resinous component of the material during the hole forming process.

Where holes are drilled in epoxy impregnated fiber glass laminate materials (such as those employed to make printed circuit boards), friction of the drill bit against the material raises the temperature of the bit. Often, drill bit temperatures are generated which exceed the melting temperature of many resin systems. The drill bit thus picks up melted resin on its course through the material being drilled, and this melted accretion is smeared in the barrel of the hole. In laser drilling to contact interior conductors in organic insulating substrates, a similar resin accretion or smear can develop on the exposed conductor surface.

While the problem of resin smear on the hole walls may be ignored in some applications, it is at times imperative that it be removed. For example, when a multilayer circuit board is made, holes are formed in a resin-containing material which includes a plurality of parallel planar metallic conductors, with the hole perpendicular to, and communicating with, two or more parallel metallic conductors. It is often desired to metallize the hole walls in order to form a conductive path between two or more of the metallic conductors, so the resin smear must be removed from the edges of the hole through the metallic conductors if conductive contact between the metallized hole wall and the metallic conductors is to be achieved. Thus, when circuit board holes are drilled through a copper clad base plastic laminate or through a plastic laminate containing internal conductor planes such as in a multilayer circuit board, resin smear on the metallic surfaces exposed to the walls of the holes must be removed to achieve proper functioning of the plated through-holes.

Plated through-holes as described above are useful as electrical connections between printed circuits having metallic conductors on both sides of the plastic laminate or between two or more of the various planes and surface conductor layers in multilayer boards. The electrical and mechanical integrity required for this function can only be attained by insuring complete removal of resinous materials from the entire inner circumference of the portion of the metallic conductor exposed by the hole.

Numerous methods are known for removing resin smear. One approach is a mechanical one and involves channeling a dry or wet stream of abrasive particles through such holes. A similar method is the use of hydraulic pressure to force a thick slurry of abrasive material through the holes. However, these mechanical methods are generally slow and difficult to control. Furthermore, complete removal or smear in all holes in a given circuit board is difficult to achieve.

Chemical methods have also been used to desmear holes. Generally, the chemicals used attack the smeared resinous coating. The chemicals include, for example, concentrated sulfuric acid (down to about 90 percent concentration). Smeared epoxy resin, which is usually less than about 0.001 inch thick, can be removed with about one minute's treatment with concentrated sulfuric acid. Unfortunately, the high sulfuric acid concentration required is very hazardous and requires extraordinary precautions by operators. Also, undesirably rough holes are produced. In addition, the concentrated sulfuric acid rapidly absorbs water, which limits its useful life span and can cause variations in the immersion times required to desmear the holes.

Another chemical smear removal agent which has been employed is chromic acid. Unfortunately, it is slower than concentrated sulfuric acid and still requires operator caution and special equipment. Chromic acid also presents toxicity and waste disposal problems.

Permanganate has also been used for smear removal and for etching of various materials. For example, U.S. Pat. No. 1,969,678, issued Aug. 7, 1934 to White et al. discloses etching solutions for metals, e.g. copper, which contain ferric chloride and an oxidizer which converts ferrous ions to ferric ions. This oxidizer may be $KMnO_4$. Of course, these etching solutions would have at best limited utility in preparing circuit boards since the boards often contain a copper layer which would be subject to removal by the ferric chloride.

U.S. Pat. No. 3,293,148, issued Dec. 20, 1966 to Dell et al., discloses a cleaning solution for metals which contains an oxidizer, alkali metal hydroxide, gluconic acid and polyethylene glycol. Among the many oxidizers disclosed are permanganates, although they are not preferred and no example is given employing them.

U.S. Pat. No. 3,425,947, issued Feb. 4, 1969 to Rausch et al., relates to solid concentrates useful in preparing treatment baths for removing organic substances from metal surfaces. The concentrates contain about 50–90% alkali metal hydroxide, 10–50% permanganate and 1 gram equivalent/gram mole of permanganate of a reducing agent. Typical solutions prepared by the solid concentrates contain about 105 g/l of $KMnO_4$ and about 250 g/l $NaOH$.

U.S. Pat. No. 3,457,107, issued July 22, 1969 to Mickelson et al., discloses compositions for chemically polishing stainless steel. These compositions are aqueous solutions containing alkali metal hydroxides, e.g. $NaOH$, and alkali metal permanganate, e.g. $KMnO_4$. Typical solutions contain about 39 g/l $NaOH$, 16 g/l $KMnO_4$ and 4.8 g/l $Na_2CO_3$; or 78 g/l $NaOH$, 32 g/l $KMnO_4$ and 9.6 g/l $Na_2CO_3$.

U.S. Pat. No. 3,489,625, issued Jan. 13, 1970 to Dell et al., discloses acid pickling of carbon steel followed by treatment with an alkaline permanganate solution. The alkaline permanganate solution contains about 5–50 g/l $KMnO_4$ and about 10–200 g/l alkali metal hydroxide.

U.S. Pat. No. 3,506,397, issued Apr. 14, 1970 to Vincent et al., relates to the treatment of ABS resin with a composition containing phosphoric acid and potassium permanganate.

U.S. Pat. Nos. 3,598,630 and 3,647,699, issued respectively on Aug. 10, 1971 and Mar. 7, 1972 to Doty et al., are also related to phosphoric acid/potassium permanganate solutions for treating ABS polymers.

U.S. Pat. No. 3,625,758, issued Dec. 7, 1971 to Stahl et al., deals with the manufacture of printed circuit boards. As one step in the manufacturing process, the board is treated with an oxidization and degradating agent which may be a permanganate solution. However, no details or specific examples regarding the composition of the permanganate solution are provided.

U.S. Pat. No. 3,652,351, issued Mar. 28, 1972 to Guisti, discloses compositions for etching synthetic polymers. These etchant compositions contain 2.5-8.5% potassium and/or sodium manganate, 30-70% sodium and/or potassium hydroxide and 21.5-67.5% water. These compositions are prepared from the corresponding permanganate which is reacted with a large amount of sodium and/or potassium hydroxide at elevated temperature to reduce the permanganate to manganate. For instance, in Example 1 Guisti combines 50 g KOH, 5 g $KMnO_4$ and 20 g water and heats the resulting mixture at 80°-90° C. until the deoxidation reaction is complete. Likewise, in Example 2 the reaction mixture contains 45 g NaOH, 6 g $NaMnO_4$ and 20 g water, and Example 3 employs 25 g NaOH, 25 g $KMnO_4$, 2.5 g $NaMnO_4$ and 20 g water.

Attempts were made to duplicate Guisti's examples and it was found that the permanganate-containing reaction mixtures were not liquid solutions but rather paste-like materials which crystallized even at boiling temperatures. This is perhaps not surprising, however, since the reaction mixtures contain vast quantities of alkali metal hydroxide. More particularly, the reaction mixture for Example 1 contains (on a grams/liter basis) 1000 g/l KOH and 105 g/l $KMnO_4$; Example 2 uses 990 g/l NaOH and 132 g/l $NaMnO_4$; and Example 3 uses 575 g/l NaOH, 575 g/l KOH, 108 g/l $NaMnO_4$ and 108 g/l $KMnO_4$. Finally, it was found that the manganate compositions produced by duplicating Guisti's examples were not satisfactory etchants.

U.S. Pat. No. 3,833,414, issued Sept. 3, 1974 to Grisik et al., discloses a method for removal of aluminide coatings from metal by treating the metal with a mixed acid solution, followed by treatment with an alkaline permanganate aqueous solution, and finally a second treatment with the mixed acid. The alkaline permanganate aqueous solution contains 8-11% NaOH, 8-11% $Na_2CO_3$ and 4-6% $KMnO_4$.

U.S. Pat. Nos. 4,042,729; 4,054,693 and 4,073,740, issued respectively on Aug. 16, 1977; Oct. 18, 1977 and Feb. 14, 1978 to Polichette et al., relate to treating resinous surfaces with a solution of manganate ($MnO_4^{2-}$) and permangante ($MnO_4^-$) where the molar ratio of manganate/permanganate is up to 1.2 and the pH of the solution is 11-13. Polichette et al. teach that higher pH increases the $MnO_4^{2-}/MnO_4^-$ ratio, which is undesirable.

U.S. Pat. No. 4,294,651, issued Oct. 13, 1981 to Ohmura, discloses etching of a semiconductor substrate with a composition containing a fluorine compound (7-38%), an oxidizing agent such as $KMnO_4$ (2.5-7%) and alkali such as KOH or NaOH (1-10%).

U.S. Pat. No. 4,425,380, issued Jan. 10, 1984 to Duffy et al., discloses a process for removing resin smear (desmearing) from a interior wall of a hole in a resinous substrate. The process involves contacting the substrate with an alkaline permanganate solution, having a pH between 11 and 13, at elevated temperature. With regard to the permanganate, it is stated that any metal salt of permanganic acid which is stable and soluble to the extent of at least 10 g/l in water can be employed, sodium permanganate and potassium permanganate being preferred. While it is disclosed that amounts from about 10 g/l up to the limit of solubility of permanganate may be employed, it is emphasized that especially good results are obtained with $NaMnO_4$ or $KMnO_4$ in the range of 10-60 g/l. Further, it is taught that the rate of bonding sites formation increases up to about 60 g/l, but no further increases in rate is noted above this level. This, Duffy et al. place a practical upper limit of 60 g/l of permanganate on their desmearing solutions.

The desmearing solutions disclosed by Duffy et al. also have a narrow pH range of 11-13. Duffy et al. state repeatedly that a higher pH leads to an assortment of severe problems. For example, they state at col. 3, lines 2-5 that the use of high pH permanganate solution results in localized inactive areas when used to desmear epoxy resin and etch back polymide in circuit boards. These inactive areas lead to the formation of pin holes or plating voids when the board is subsequently electrolessly plated with metal. This problem of pin holes and plating voids after cleaning with high pH permanganate solutions is referred to again at col. 3 lines 37-40.

Duffy et al. point to other problems caused by high pH, i.e. above pH 13, permanganate solutions. At col. 4, lines 27-29 they state that large amounts of residual manganese are found when alkaline permanganate treating solutions having a pH above 13 are used. They further state at col. 4, lines 31-38 that when these high pH permanganate solutions deposited on a substrate were not neutralized, subsequent electroless metal deposition was rapid but the electroless metal bath spontaneously decomposed. On the other hand, when the high pH permanganate treating solution was neutralized, residues remained on the substrate resulting in voids in the hole when a metal was subsequently electrolessly deposited thereon. Thus, the clear inference from the teachings of Duffy, et al. is that high pH permanganate solutions would be expected to perform poorly, if at all, in a desmearing process, largely due to their inability to provide a substrate which can be electrolessly plated satisfactorily.

The problem of manganese residues deposited on the substrates when high pH permanganate solutions are employed is specifically addressed by Duffy, et al. in their Examples. There, it is demonstrated that when a high pH $KMnO_4$ solution is used relatively large amounts of manganese residue are left on the substrate. According to Duffy et al. these manganese residues can not be removed simply with an acid neutralization step. An additional step involving immersion in an alkaline solution is required to remove substantially all of the manganese residues.

U.S. Pat. No. 4,430,154, issued Feb. 7, 1984 to Stahl et al., relates to a method for removing an adhesive medium from printed circuit boards without corroding the base material or copper conductor on the board by treatment with an alkaline permanganate or chromic acid solution. The alkaline permanganate solution disclosed contains 50 g/l $KMnO_4$ and 50 g/l NaOH.

British Pat. No. 1,479,558 of Kollmorgen Corporation, published on July 13, 1977, also relates to desmearing and etchback of printed circuit boards and wire conductors by treatment with an alkaline permanganate solution containing potassium permanganate, a strong base (e.g. NaOH) and a fluorinated hydrocarbon wetting agent. The solution contains about 10-75 g/l $KMnO_4$ and enough NaOH to achieve a pH of 13-14. Typically, about 40 g/l of NaOH is employed. The desmearing process is conducted at temperatures from about 35°-50° C., it being disclosed that temperatures above 70° C. result in increased permanganate demand in order to maintain the bath composition without yielding any apparent advantage, i.e. the overall process becomes less efficient in terms of permanganate consumption.

Thus, it can be seen from the foregoing that aqueous permanganate solutions are well known for a variety of uses. However, the art has focused almost exclusively upon solutions containing potassium permanganate. Unfortunately, however, $KMnO_4$ has very limited solubility in water, being soluble in water at 20° C. at a maximum of only about 63.8 g/l. Also, even at its saturation point $KMnO_4$ is a relatively slow etchant.

In an effort to improve the etching efficiency of $KMnO_4$ the art has in recent years turned to highly alkaline $KMnO_4$ solutions. In particular, U.S. Pat. No. 4,425,380 and British Pat. No. 1,479,553 discussed above deal with $KMnO_4$ solutions having a pH of 11-13 and 13-14 respectively. While this high alkalinity did appear to confer some benefits upon the $KMnO_4$ solutions, it leads to other problems such as the deposition of manganese residues which are difficult to remove. For this reason, it was believed that $KMnO_4$ solutions having a pH above about 13 would not produce satisfactory etching results (see the above discussion of U.S. Pat. No. 4,425,380).

It has now been discovered that many of the problems encountered with the prior art $KMnO_4$ solutions can be overcome completely with aqueous, alkaline liquid solutions of sodium permanganate which contain a co-ion of $MnO_4^-$ selected from the group consisting of $K^+$, $Rb^+$, $Cs^+$ and mixtures thereof. Desmearing and etch rates found with the solutions of this invention are much faster than with $KMnO_4$ solutions, and while manganese deposits still occur with the solutions of this invention, the deposits are readily removed with a simple acid neutralization, as opposed to the far more complicated treatment required with $KMnO_4$ solutions.

SUMMARY OF THE INVENTION

The present invention provides aqueous, alkaline liquid $NaMnO_4$ solutions comprising water, alkali metal hydroxide, $NaMnO_4$ and from about 0.1 to about 3.0 moles per mole of $MnO_4^-$ of a co-ion for $MnO_4^-$ selected from the group consisting of $K^+$, $Cs^+$, $Rb^+$ and mixtures thereof.

The present invention also provides a process for preparing a resinous substrate for subsequent metallization which comprises contacting said substrate with an aqueous, alkaline liquid $NaMnO_4$ solution comprising water, alkali metal hydroxide, $NaMnO_4$ and from about 0.1 to about 3.0 moles per mole of $MnO_4^-$ of a co-ion for $MnO_4^-$ selected from the group consisting of $K^+$, $Cs^+$, $Rb^+$ and mixtures thereof.

This invention also provides an improved process for desmearing resin from the inside walls of holes formed in resinous substrates wherein the improvement comprises contacting the substrate with an aqueous, alkaline liquid solution comprising water, alkali metal hydroxide, $NaMnO_4$ and from about 0.1 to about 3.0 moles per mole of $MnO_4^-$ of a co-ion for $MnO_4^-$ selected from the group consisting of $K^+$, $Cs^+$, $Rb^+$ and mixtures thereof.

Also provided by this invention is an improved hole cleaning process for multilayer circuit boards wherein the improvement comprises contacting the multilayer circuit board with an aqueous, alkaline liquid solution comprising water, alkali metal hydroxide, $NaMnO_4$ and from about 0.1 to about 3.0 moles per mole of $MnO_4^-$ of a co-ion for $MnO_4^-$ selected from the group consisting of $K^+$, $Cs^+$, $Rb^+$ and mixtures thereof.

Further provided by the present invention is a process for etching back the surface of a circuit board, especially the walls of holes therein, which comprises contacting the circuit board with an aqueous, alkaline liquid solution comprising water, alkali metal hydroxide, $NaMnO_4$ and from about 0.1 to about 3.0 moles per mole of $MnO_4^-$ of a co-ion for $MnO_4^-$ selected from the group consisting of $K^+$, $Cs^+$, $Rb^+$ and mixtures thereof.

DETAILED DESCRIPTION OF THE PREFERRED EMBODIMENTS

Figure 1:
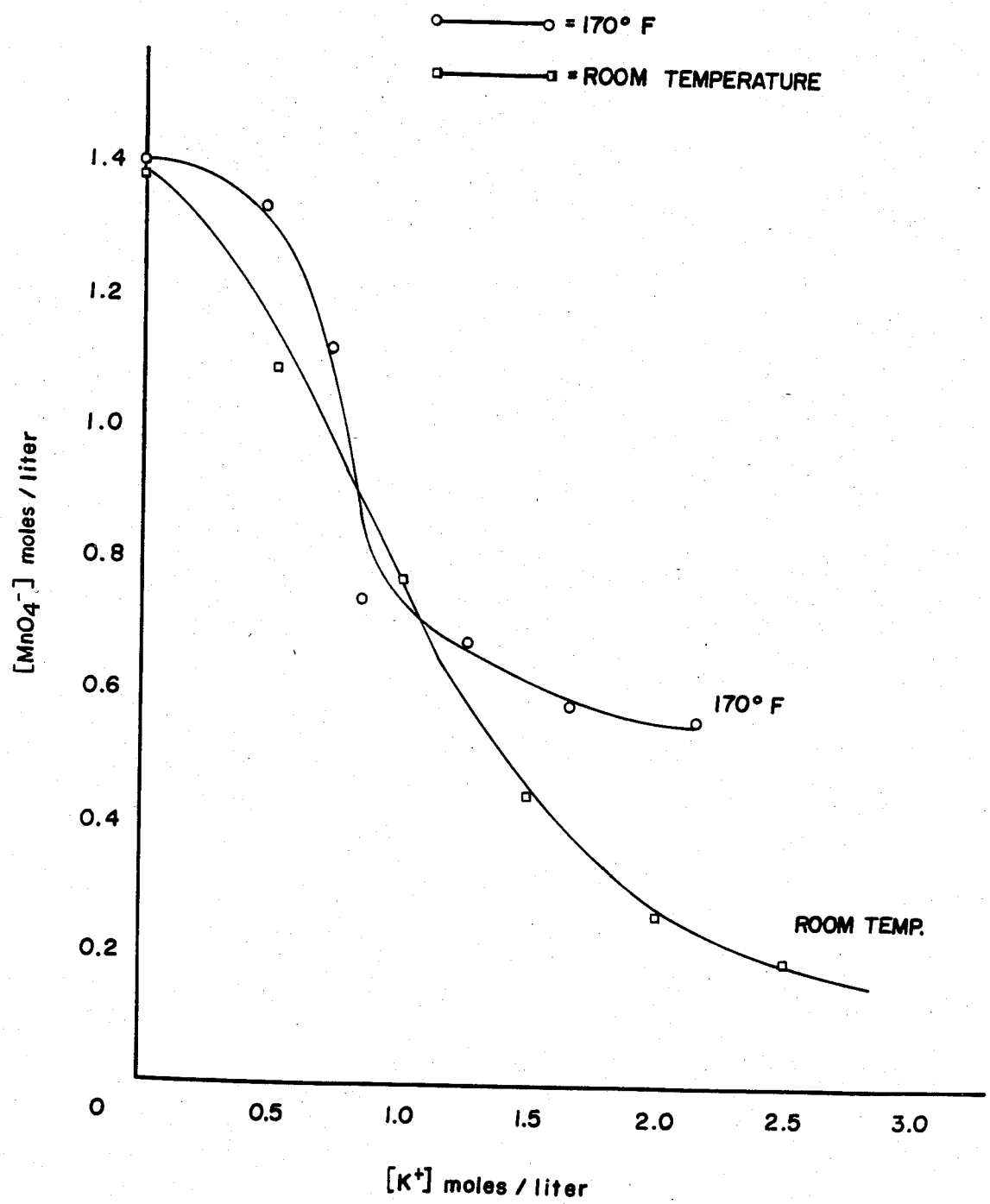
FIG. 1 is a graphical representation of the data presented in Example 1. The graph is a plot of $MnO_4^-$ concentration in moles/liter versus $K^+$ (from KOH) concentration in moles/liter for a 200 g/l $NaMnO_4$ solution at room temperature and at 170° F.

In accordance with the present invention there are provided permanganate solutions which are artificially maintained at the point of saturation of potassium, cesium or rubidium permanganate while having excess $MnO_4^-$ still in solution. This is accomplished by adding a $K^+$, $Cs^+$, $Rb^+$ ion (or mixtures thereof) to an aqueous solution of $NaMnO_4$ in an amount from about 0.1 to about 3.0 moles of $K^+$, $Cs^+$ and/or $Rb^+$ ion per mole of $MnO_4^-$.

It has been quite surprisingly found that the solutions of this invention, when used to etch resin substrates, provide etch rates which are comparable to solutions containing higher concentrations of pure $NaMnO_4$. In other words, this invention allows the use of permanganate etchant solutions which use lower total permanganate concentrations than those employing "pure" $NaMnO_4$ (i.e. no co-ion is present in the solution) while maintaining an etch rate which is at least as good as, if not better than, that of the pure $NaMnO_4$ solution.

The solutions of the present invention comprise water, an alkali metal hydroxide, $NaMnO_4$ and a co-ion for $MnO_4^-$ selected from $K^+$, $Cs^+$, $Rb^+$ or mixtures thereof. The specific components employed in the solutions and their amounts may vary considerably.

The alkali metal hydroxide used in the solutions of this invention may be any of the alkali metal hydroxides including NaOH, KOH, CsOH, RbOH or mixtures thereof. It should be emphasized that the alkali metal hydroxide is one convenient source of the $K^+$, $Cs^+$ and/or $Rb^+$ co-ion which must be present in the solution. Thus, for example, if KOH is employed as the alkali metal hydroxide (either alone or in combination with NaOH) it contributes toward the required alkalinity while at the same time providing $K^+$ ions. Of the alkali metal hydroxides, NaOH is the preferred choice since it can be used in any desired amount without fear of introducing an excess of co-ion into the solution.

The amount of alkali metal hydroxide employed in the solutions of the present invention can vary greatly. In general, it is necessary only that the solution contain sufficient alkali metal hydroxide that the removal of manganese residues from the surface of materials etched with the solutions of this invention can be accomplished readily, e.g. by acid neutralization only. Normally, the amount of alkali metal hydroxide used will be sufficient to provide at least about 1 mole of $OH^-$ per liter of solution. The maximum amount of alkali metal hydroxide is determined only by its solubility limit in the solution. However, it must be kept in mind that if the alkali metal hydroxide, or any portion thereof, is other than NaOH, the amount of a non-sodium alkali metal ion ($K^+$, $Cs^+$ and/or $Rb^+$) should not exceed about 3.0 moles of non-sodium ion per mole of $MnO_4^-$ in the solution. While solutions which are saturated with alkali metal hydroxide are useful in the practice of this invention, practical considerations dictate a maximum amount of alkali metal hydroxide which will produce of solution having about 10 moles of $OH^-$ per liter of solution. Preferred amounts of alkali metal hydroxide are those which provide from about 1–4 moles of $OH^-$ per liter of solution. When the material to be etched is an epoxy resin, about 4 moles of $OH^-$ per liter of solution is especially preferred.

The amount of $NaMnO_4$ in the solutions of this invention may likewise vary widely, it being required only that the solution contain enough $NaMnO_4$ to provide the desired etch rate. Generally, about 70 grams of $NaMnO_4$ or more per liter of solution will provide a satisfactory etch rate for circuit boards. The maximum amount of $NaMnO_4$ in the solution will be determined only by its solubility limit, which is in turn determined by the amount of co-ion present in the solution. Since the co-ion serves to depress the solubility of the $NaMnO_4$, the solution will never be at its theoretical saturation point for $NaMnO_4$. As with the alkali metal hydroxide, practical considerations dictate a maximum amount of $NaMnO_4$ which should be employed in the solution. Generally, this maximum amount is about 400 g/l, solutions containing more than this amount being very aggressive etchants which may produce undesirably rough surfaces on some etched materials. Preferably, the amount of $NaMnO_4$ will be about 140 g/l of soluble permanganate. Solutions containing this preferred amount provide excellent etch rates and are economically practical. When the material to be etched is an epoxy resin, as is normally found in printed circuit boards, an amount of $NaMnO_4$ of about 140 g/l is especially preferred.

When the term "grams/liter" is used with respect to the solutions of this invention, it refers to the amount of the particular component which is in solution at room temperature, i.e. about 25° C.

The co-ion present in the solutions of this invention may be supplied from a variety of sources. Indeed, the co-ion may be supplied by any alkali metal compound which does not adversely effect the performance of the solution. Conveniently, the co-ion may be supplied by $KMnO_4$ or an alkali metal hydroxide other than NaOH, including KOH, CsOH or RbOH. The co-ion, regardless of its source, is present in the solution in an amount of from about 0.1 mole to about 3.0 moles of co-ion per mole of $MnO_4^-$ in the solution. A preferred amount of co-ion is from about 0.1 mole to about 1.5 mole per mole of $MnO_4^-$. Indeed one quite unexpected advantage of this invention is that very small amounts of co-ion, e.g., 0.1–1.5 moles per mole of $MnO_4^-$, actually increase the etching efficiency of the solutions of this invention compared to those solutions which contain larger amounts of co-ion, e.g. 1.5–3.0 moles of co-ion per mole of $MnO_4^-$.

It should be noted that the above amounts of $OH^-$, $MnO_4^-$ and co-ion refer to the amount (whether expressed as g/l or moles/l) which is in solution for a given aqueous, alkaline solution in accordance with this invention. In actual practice, since the solution is at its saturation point with respect to $MnO_4^-$, there will be some $KMnO_4$ (assuming $K^+$ is the co-ion used) present as a precipitate. However, the presence of this precipitate is not detrimental to the solution's performance, but rather acts as a "reservoir" from which fresh $MnO_4^-$ can be dissolved as the $MnO_4^-$ in the original solution is depleted.

It should be further noted that the desired level of soluble $MnO_4^-$ in the solutions of this invention can be achieved in several ways. Basically, the solutions are prepared simply by dissolving the desired amount of each component in the requisite amount of water. The ingredients may be added to the water in solid form or in the form of highly concentrated solutions. These latter solutions are sometimes preferred since their use can help avoid overheating of the solution of this invention as it is being prepared. The desired amount of $MnO_4^-$ can be achieved be adjusting the amount of $NaMnO_4$ and co-ion present in the solution. Thus, for example, a highly concentrated $NaMnO_4$ solution (e.g. 400 g/l) may require large amounts of co-ion to be used to depress the solubility of $MnO_4^-$ to the desired level (e.g. 140 g/l). However, less concentrated $NaMnO_4$ solutions (e.g. 150 g/l) would require only minor amounts of co-ion to reach the same (e.g. 140 g/l) $MnO_4^-$ concentration.

The solutions of the present invention are especially useful in processes which prepare resinous substrates for metallization, for desmearing resin from the inside walls of holes formed in resinous substrates, for hole cleaning processes for multilayer circuit boards and for etchback processes for circuit boards. The present invention includes such processes which employ the aqueous alkaline solutions of this invention.

The processes of this invention may be practiced in the manner well known in the art (such as that disclosed in U.S. Pat. No. 4,425,380 and British Patent No. 1,479,558 which are hereby incorporated by reference herein) using the etchant solutions of this invention to desmear, etchback or both. Thus, the processes of this invention may be carried out in the following typical manner which is described with respect to the processing of a printed circuit board (PCB):

1. The PCB is precleaned before etching with the solution of this invention. This is to remove excess oils or dirt, to uniformly wet the resin and/or metal surfaces, and to optionally soften the resin slightly with an organic solvent for ease of permanganate attack.

2. The cleaned PCB is rinsed to remove the cleaning solution of step 1.

3. The PCB is then placed in a solution in accordance with this invention for a time and a temperature sufficient to effect the desired resin removal. The actual conditions employed will vary with the type of etching desired (e.g. desmearing may require only 1–5 minutes; etchback may require 5–60 minutes or more at a typical bath temperature of about 170° F.) and type resin.

4. The PCB is thoroughly rinsed.

5. The PCB is then contacted with an acid neutralization solution (e.g. dilute sulfuric acid and a reducing agent) to remove essentially all of the permanganate and manganese (principally manganese dioxide) residues from the PCB.

6. The PCB is rinsed again thoroughly.

EXAMPLE 1

Several solutions were prepared to determine the effect of co-ion concentration on the amount of $MnO_4^-$ in solution. $MnO_4^-$ concentration at various $K^+$ concentrations (where the source of $K^+$ was KOH) was determined by titration for solutions at room temperature and at 170° F. The results are summarized in Table 1 and presented graphically in FIG. 1 where $MnO_4^-$ concentration in moles/liter is plotted versus $K^+$ concentration in moles/liter.

1. A circuit board having copper clad on both sides of an epoxy resin/fiber glass substrate is cut to a 3"×3" size.

2. The copper is etched completely from both sides of the board using a standard copper etching bath, e.g. a $H_2O_2/H_2SO_4$ solution.

3. The resulting board is baked at 100° C. until completely dry and then weighed.

4. The board is then placed in the solution indicated in the following examples, at the temperature and for the length of time also indicated in the examples.

5. The board is removed from the solution and placed in an acid neutralization solution, e.g. an aqueous acid solution containing 5% $H_2SO_4$ and 50 g/l reducing agent.

6. The board is removed from the neutralizer, baked at 100° C. until completely dry and weighed again.

7. Total weight loss (or gain) is determined by comparing the weight of the board at step 3 and step 6. The change in weight is indicated in the following examples as "Δwt" and indicates the amount of material etched from the board (or weight added to the board) by the permanganate solution.

Several solutions in according with this invention were tested by the above-described method. The results

TABLE 1

| Sol'n No. | Total $K^+$ added[1] | Total $K^+$ added/ Total $MnO_4$-added[1] | Soluble $MnO_4$-[1] | Moles $K^+$/Moles $MnO_4$-[2] in Solution |
|---|---|---|---|---|
| | | Room Temperature | | |
| 1 | 0 | 0 | 1.392 | 0 |
| 2 | 0.5 | 0.36 | 1.090 | 0.17/1 |
| 3 | 1.0 | 0.71 | 0.776 | 0.48/1 |
| 4 | 1.5 | 1.07 | 0.453 | 1.22/1 |
| 5 | 2.0 | 1.43 | 0.273 | 3.2/1 |
| 6 | 2.5 | 1.79 | 0.201 | 6.5/1 |
| 7 | 3.0 | 2.14 | 0.169 | 10.5/1 |
| | | 170° F. | | |
| 8 | 0 | 0 | 1.398 | 0 |
| 9 | 0.5 | 0.36 | 1.357 | .34/1 |
| 10 | 1.0 | 0.71 | 1.126 | .65/1 |
| 11 | 1.5 | 1.07 | 0.747 | 1.15/1 |
| 12 | 2.0 | 1.43 | 0.684 | 1.89/1 |
| 13 | 2.5 | 1.79 | 0.593 | 2.87/1 |
| 14 | 3.0 | 2.14 | 0.563 | 3.86/1 |

[1] in moles/liter

[2] calculated as $\frac{\text{moles/liter } K^+ \text{ added-(1.39-moles/liter } MnO_4\text{-in solution))}}{\text{moles/liter } MnO_4\text{-in solution}}$ The data in Table 1 demonstrates that the amount of $MnO_4^-$ in solution decreases with increasing co-ion ($K^+$) concentration.

In the following examples, various permanganate-containing solutions are tested to determine their usefulness as desmearing or etchback baths. For each test, the following procedure was followed:

are tabulated in Table 2. This data is also represented graphically in FIG. 2.

TABLE 2

| EX. NO. | NaMnO$_4$ (g/l) | KMnO$_4$ (g/l) | NaOH (g/l) | Time (Min.) | Temp (°F.) | Δ wt. |
|---|---|---|---|---|---|---|
| 2 | 100 | 25 | 75 | 15 | 170 | −0.1818 |
| 3 | 100 | 50 | " | " | " | −0.1911 |
| 4 | 100 | 75 | " | " | " | −0.2131 |
| 5 | 50 | 25 | " | " | " | −0.1060 |
| 6 | 50 | 50 | " | " | " | −0.1316 |
| 7 | 50 | 75 | " | " | " | −0.1433 |
| 8 | 150 | 25 | " | " | " | −0.2206 |
| 9 | 150 | 50 | " | " | " | −0.2595 |
| 10 | 150 | 75 | " | " | " | −0.2344 |

Additional tests were conducted according to the above test procedure where $K_2CO_3$ was the source of the co-ion in the solution. The results are provided in Table 3. This data in Table 3 is also represented graphically in FIG. 2 and FIG. 3.

TABLE 3

| EX. NO. | NaMnO$_4$ (g/l) | NaOH (g/l) | K$_2$CO$_3$ (g/l) | TIME (Min.) | TEMP (°F.) | Δ wt. |
|---|---|---|---|---|---|---|
| 11 | 200 | 120 | 13.8 | 15 | 170 | −0.1353 |
| 12 | " | " | 27.6 | " | " | −0.1082 |
| 13 | " | " | 41.4 | " | " | −0.1146 |
| 14 | " | " | 55.28 | " | " | −0.0954 |
| 15 | " | " | 69.1 | " | " | −0.0607 |
| 16 | " | " | 82.9 | " | " | −0.0568 |
| 17 | " | " | 110.5 | " | " | −0.0438 |
| 18 | " | " | 165.8 | " | " | −0.0323 |

The following examples summarized in Table 4 demonstrate the effect on etch efficiency of adding increasing amounts of K$^+$ to a NaMnO$_4$/NaOH etchant solution. It should be noted that in all of the examples shown in Table 4 the amount of OH- in the various solutions remains constant. With the exception of Example No. 18 (which utilizes no KOH for comparison purposes) the data in Table 4 is also presented graphically in FIG. 2 and FIG. 3.

TABLE 4

| EX. NO. | NaMnO$_4$ (g/l) | KOH (moles/l) | NaOH (moles/l) | Mole K$^+$/ mole MnO$_4$- | Moles MnO$_4$-* | Time (min) | Temp (°F.) | Δ wt |
|---|---|---|---|---|---|---|---|---|
| 19 | 200 | 0 | 3.0 | 0/1 | 1.398 | 15 | 170 | −0.11611 |
| 20 | " | 0.5 | 2.5 | 0.36/1 | 1.357 | " | " | −0.133 |
| 21 | " | 1.0 | 2.0 | 0.71/1 | 1.126 | " | " | −0.0770 |
| 22 | " | 1.5 | 1.5 | 1.07/1 | 0.747 | " | " | −0.0890 |
| 23 | " | 2.0 | 1.0 | 1.43/1 | 0.684 | " | " | −0.0717 |
| 24 | " | 2.5 | 0.5 | 1.79/1 | 0.593 | " | " | −0.0977 |
| 25 | " | 3.0 | 0.0 | 2.14/1 | 0.563 | " | " | −0.0842 |

*Moles of MnO$_4$- in 170° F. solution as determined by H$_2$O$_2$ titration.

By way of comparison, etchant solutions containing KMnO$_4$ as the permanganate source was tested with the following results.

TABLE A
(Comparison)

| EX NO. | KMnO$_4$ (g/l) | NaOH (g/l) | TIME (Min.) | TEMP (°F.) | Δ wt. |
|---|---|---|---|---|---|
| A | 42 | 83 | 15 | 170 | −0.0468 |
| B | 49 | 115 | " | " | −0.0573 |
| C | 56 | 147 | " | " | −0.0489 |

Figure 2:
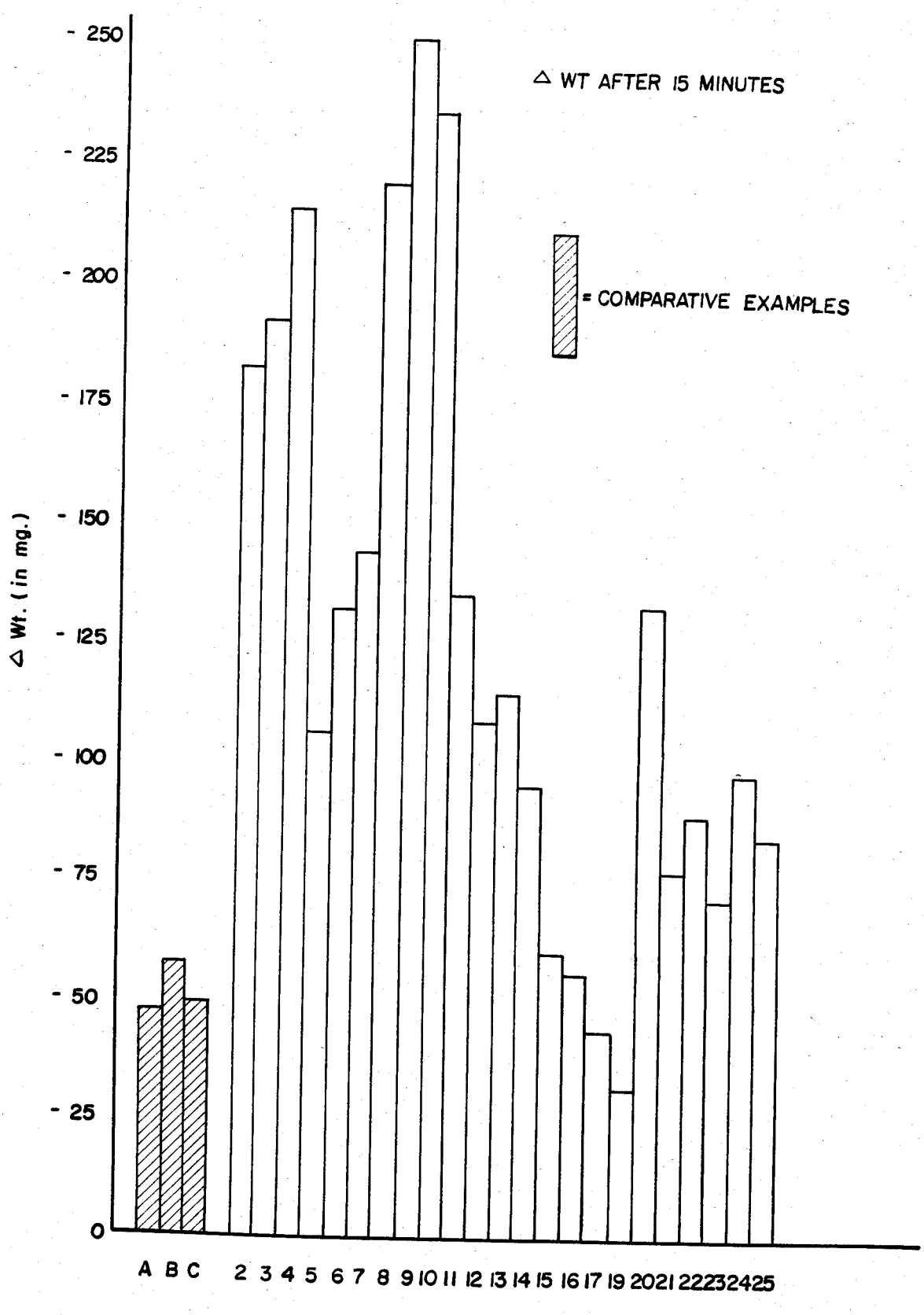
FIG. 2 is a graphical representation of the data presented in Comparative Examples A, B, and C and Examples 2-17 and 20-25. The bar graph shows the $\Delta$wt in mg. after 15 minutes of etching for each example.

The data from Table A is also represented graphically in FIG. 2.

Figure 3:
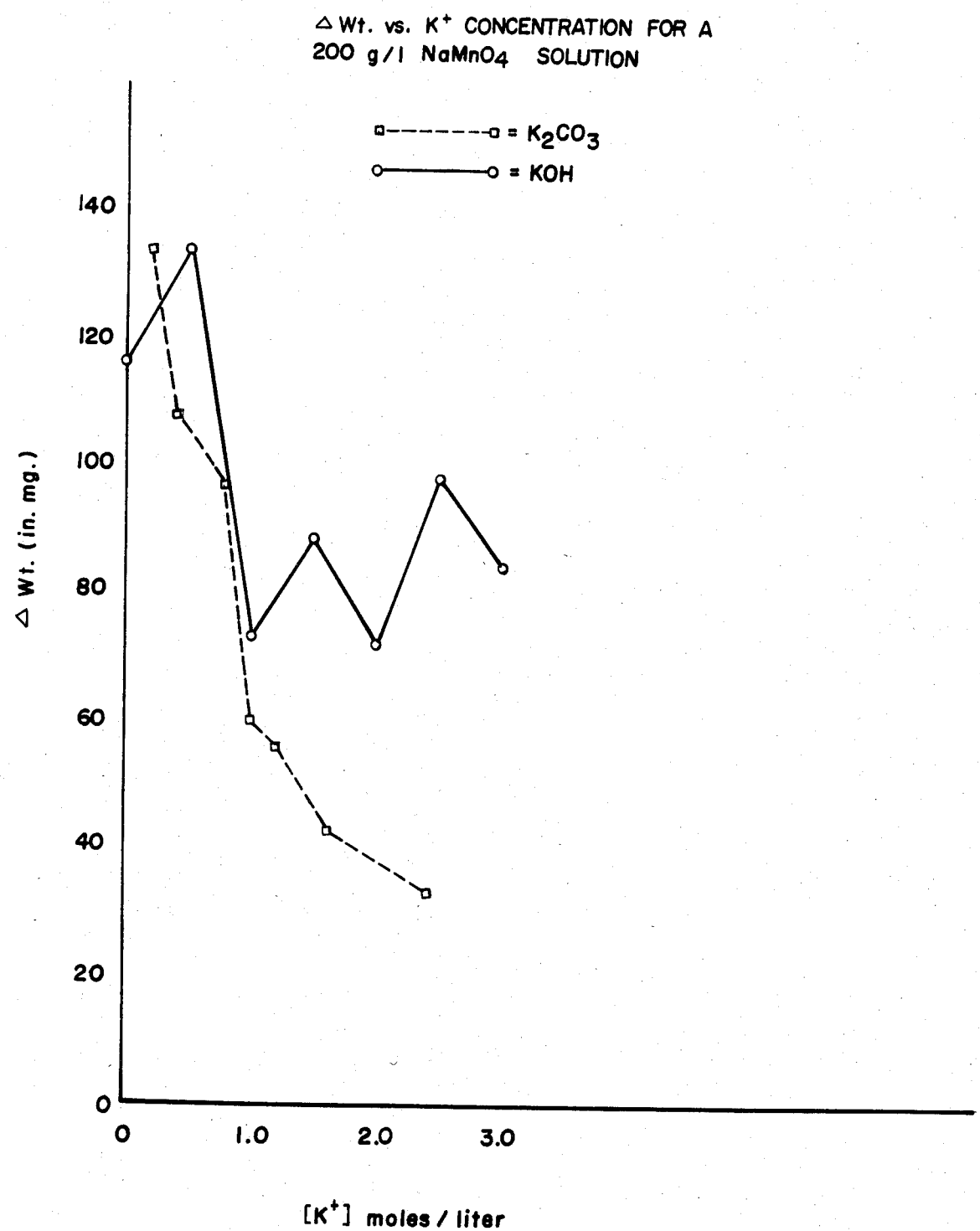
FIG. 3 is a graphical presentation of the data presented in Examples 11-18 and 20-25. The graph is a plot of $\Delta$wt in mg. versus $K^+$ concentration in moles/liter for a 200 g/l $NaMnO_4$ solution. Results from both KOH and $K_2CO_3$ are shown.

The data from Tables 2-4 is quite surprising, especially in view of Table 1. Table 1 (and FIG. 1) clearly demonstrate that MnO$_4$- concentration decreases rapidly as co-ion concentration increases. Therefore, one would assume that etch performance (Δwt) would likewise decrease rapidly. However, exactly the opposite occurs. FIG. 3, for instance, shows that Δwt actually increases as KOH is added to the solution. As the KOH concentration increases, Δwt does begin to drop off and then level out again (although the Δwt values following the initial drop do show a rising trend). It must be emphasized, though, that the Δwt value where performance levels out is still dramatically higher than the wt achievable with a standard KMnO$_4$ solution. (see FIG. 2, Ex. A, B and C vs. Ex. 19-24). While this effect is not as pronounced with K$_2$CO$_3$, superior etch rates are still achieved despite the expectation that etch rate will decrease with increasing K$^+$ concentration.

I claim:

1. An aqueous, alkaline liquid NaMnO$_4$ solution comprising water alkali metal hydroxide, NaMnO$_4$ and from about 0.1 to about 3.0 moles per mole of MnO$_4$- of a co-ion for MnO$_4$- selected from the group consisting of K$^+$, Cs$^+$, Rb$^+$ and mixtures thereof.

2. A solution according to claim 1 wherein the co-ion is present in an amount from about 0.1 to about 1.5 mole per mole of MnO$_4$-.

3. A solution according to claim 1 wherein the co-ion is K$^+$.

4. A solution according to claim 1 wherein the alkali metal hydroxide is NaOH.

5. A solution according to claim 1 wherein the alkali metal hydroxide is present in an amount which provides at least about 1 mole of OH-per liter of solution.

6. A solution according to claim 5 wherein the alkali metal hydroxide is present in an amount which provides from about 1 to about 4 moles of OH- per liter of solution.

7. A solution according to claim 1 which contains at least about 70 g/l NaMnO$_4$.

8. A solution according to claim 7 which contains about 70 g/l to about 400 g/l NaMnO$_4$.

9. A solution according to claim 1 which contains about 140 g/l of NaMnO$_4$, about 4 moles/liter of OH- and about 0.1 to about 1.5 moles of K$^+$ per mole of MnO$_4$-.

10. A process for preparing a resinous substrate for subsequent metallization which comprises contacting said substrate with an aqueous, alkaline liquid NaMnO$_4$ solution comprising water, alkali metal hydroxide, NaMnO$_4$ and from about 0.1 to about 3.0 moles per mole of MnO$_4$ of a co-ion for MnO$_4$- selected from the group consisting of K$^+$, Cs$^+$, Rb$^+$ and mixtures thereof.

11. An improved process for desmearing resin from the inside walls of holes formed in resinous substrates wherein the improvement comprises contacting the substrate with an aqueous, alkaline liquid NaMnO$_4$ solution comprising water, alkali metal hydroxide, NaMnO$_4$ and from about 0.1 to about 3.0 moles per mole of MnO$_4$- of a co-ion for MnO$_4$- selected from the group consisting of K$^+$, Cs$^+$, Rb$^+$ and mixtures thereof.

12. An improved hole cleaning process for multilayer circuit boards wherein the improvement comprises contacting the multilayer circuit boards with aqueous, alkaline liquid NaMnO$_4$ solution comprising water, alkali metal hydroxide, $NaMnO_4$ and from about 0.1 to about 3.0 moles per mole of $MnO_4^-$ of a co-ion for $MnO_4^-$ selected from the group consisting of $K^+$, $Cs^+$, $Rb^+$ and mixtures thereof.

13. A process for etching back the surface of a circuit board which comprises contacting the circuit board with an aqueous, alkaline liquid $NaMnO_4$ solution comprising water, alkali metal hydroxide, $NaMnO_4$ and from about 0.1 to about 3.0 moles per mole of $MnO_4^-$ of a co-ion for $MnO_4^-$ selected from the group consisting of $K^+$, $Cs^+$, $Rb^+$ and mixtures thereof.

* * * * *